US012707764B2

(12) United States Patent
Cha et al.

(10) Patent No.: US 12,707,764 B2
(45) Date of Patent: Aug. 11, 2026

(54) LIGHT-EMITTING ELEMENT, METHOD OF MANUFACTURING LIGHT-EMITTING ELEMENT, AND DISPLAY DEVICE INCLUDING LIGHT-EMITTING ELEMENT

(71) Applicant: Samsung Display Co., Ltd., Yongin-si (KR)

(72) Inventors: Hyung Rae Cha, Yongin-si (KR); Dong Uk Kim, Yongin-si (KR); Young Chul Sim, Yongin-si (KR); Sung Ae Jang, Yongin-si (KR); Ji Hyun Ham, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 499 days.

(21) Appl. No.: 17/444,803

(22) Filed: Aug. 10, 2021

(65) Prior Publication Data

US 2022/0190204 A1 Jun. 16, 2022

(30) Foreign Application Priority Data

Dec. 11, 2020 (KR) ........................ 10-2020-0173694

(51) Int. Cl.
*H10H 20/01* (2025.01)
*H10H 20/831* (2025.01)
(Continued)

(52) U.S. Cl.
CPC ........ *H10H 20/831* (2025.01); *H10H 20/018* (2025.01); *H10H 20/833* (2025.01);
(Continued)

(58) Field of Classification Search
CPC . H01L 33/38; H01L 25/0753; H01L 33/0093; H01L 33/405; H01L 33/42;
(Continued)

(56) References Cited

U.S. PATENT DOCUMENTS 7,361,521 B2 4/2008 Oh et al.
8,809,875 B2 8/2014 Bibl et al.
(Continued)

FOREIGN PATENT DOCUMENTS

JP 2017-228538 A 12/2017
KR 10-0706951 B1 4/2007
(Continued)

OTHER PUBLICATIONS

Hartensveld, Matthew et al, “Effect of KOH passivation for top-down fabricated InGaN nanowire light emitting diodes,” Journal of Applied Physics, 126, 183102, 2019, Website, URL: https://aip.scitation.org/doi/full/10.1063/1.5123171, 7pp.
(Continued)

*Primary Examiner* — Matthew C Landau
*Assistant Examiner* — David W Ward
(74) *Attorney, Agent, or Firm* — Womble Bond Dickinson (US) LLP

(57) ABSTRACT

A light-emitting element includes: a first semiconductor layer including a first type semiconductor; a second semiconductor layer including a second type semiconductor different from the first type semiconductor; an active layer between one surface of the first semiconductor layer and one surface of the second semiconductor layer; a first electrode layer on another surface of the second semiconductor layer and having a first cross-sectional area; and a second electrode layer on another surface of the first semiconductor layer and having a second cross-sectional area smaller than the first cross-sectional area. A side surface of the light-emitting element defined by the first semiconductor layer, the active layer, the second semiconductor layer, and the second electrode layer is perpendicular to a main surface of the first electrode layer.

3 Claims, 17 Drawing Sheets

(51) Int. Cl.

| | |
|---|---|
| ***H10H 20/832*** | (2025.01) |
| ***H10H 20/833*** | (2025.01) |
| ***H10H 20/84*** | (2025.01) |
| ***H10W 90/00*** | (2026.01) |

(52) U.S. Cl.
CPC .......... *H10H 20/835* (2025.01); *H10H 20/84* (2025.01); *H10W 90/00* (2026.01); *H10H 20/032* (2025.01); *H10H 20/034* (2025.01)

(58) Field of Classification Search
CPC ............. H01L 33/44; H01L 2933/0016; H01L 2933/0025; H10H 20/831; H10H 29/8321; H10H 20/018; H10H 20/019; H10H 20/833; H10H 29/8323; H10H 20/835; H10H 29/8325; H10H 20/84; H10H 29/842; H10H 29/8517; H10H 29/8552; H10H 20/032; H10H 20/01; H10H 29/032; H10H 20/034; H10H 29/034; H10H 29/20; H10H 29/24; H10H 29/30; H10H 29/32; H10H 29/34; H10H 29/345; H10H 29/352; H10H 29/362; H10H 29/37; H10H 29/39; H10H 29/41; H10H 29/45; H10H 29/49; H10W 90/00; H10W 90/10; H10W 90/15; H10W 90/155; H10W 90/20; H10W 90/22; H10W 90/231; H10W 90/24; H10W 90/26; H10W 90/271; H10W 90/275; H10W 90/28; H10W 90/284; H10W 90/288; H10W 90/291; H10W 90/293; H10W 90/295; H10W 90/701; H10W 90/721; H10W 90/722; H10W 90/723; H10W 90/724; H10W 90/725; H10W 90/726; H10W 90/727; H10W 90/728; H10W 90/729; H10W 90/731; H10W 90/732; H10W 90/733; H10W 90/734; H10W 90/735; H10W 90/736; H10W 90/737; H10W 90/738; H10W 90/739; H10W 90/751; H10W 90/752; H10W 90/753; H10W 90/754; H10W 90/755; H10W 90/756; H10W 90/757; H10W 90/758; H10W 90/759; H10W 90/761; H10W 90/762; H10W 90/763; H10W 90/764; H10W 90/765; H10W 90/766; H10W 90/767; H10W 90/768; H10W 90/769; H10W 90/791; H10W 90/792; H10W 90/794; H10W 90/796; H10W 90/798; H10W 90/81; H10B 80/00; H10D 80/00; H10D 80/20; H10D 80/211; H10D 80/213; H10D 80/215; H10D 80/231; H10D 80/251; H10D 80/30; H10F 39/90; H10F 39/95; H10K 19/901; H10K 39/601; H10K 39/621; H10K 59/90; H10K 59/95; H10K 65/00; H10N 19/00; H10N 19/101; H10N 39/00; H10N 59/00; H10N 69/00; H10N 79/00; H10N 89/00; H10N 89/02

See application file for complete search history.

(56) References Cited

U.S. PATENT DOCUMENTS

| | | | | |
|---|---|---|---|---|
| 9,181,630 | B2 | 11/2015 | Shibata et al. | |
| 9,570,425 | B2 | 2/2017 | Do | |
| 9,721,998 | B2 | 8/2017 | Yamazaki | |
| 10,276,632 | B2 | 4/2019 | Lee | |
| 2011/0155997 | A1* | 6/2011 | Lee | H01L 33/387 257/E33.023 |
| 2012/0037949 | A1* | 2/2012 | Jeong | H01L 33/405 257/E33.062 |
| 2012/0228658 | A1* | 9/2012 | Sasaki | H10H 20/824 257/98 |
| 2013/0146916 | A1 | 6/2013 | Yamamoto et al. | |
| 2019/0035974 | A1* | 1/2019 | Li | H01L 25/0753 |
| 2019/0164945 | A1* | 5/2019 | Chae | H01L 25/0756 |
| 2020/0212261 | A1* | 7/2020 | Lee | H10H 20/812 |
| 2020/0219863 | A1* | 7/2020 | Bibl | H10H 20/854 |
| 2021/0036197 | A1* | 2/2021 | Noh | H01L 25/0753 |
| 2021/0202450 | A1 | 7/2021 | Min et al. | |
| 2021/0202806 | A1* | 7/2021 | Jang | H10H 20/855 |
| 2022/0068892 | A1 | 3/2022 | Cha et al. | |
| 2022/0223772 | A1 | 7/2022 | Lee et al. | |
| 2022/0223775 | A1 | 7/2022 | Lee et al. | |
| 2023/0223492 | A1* | 7/2023 | Do | H01L 33/36 257/76 |

FOREIGN PATENT DOCUMENTS

| | | | | | |
|---|---|---|---|---|---|
| KR | 10-2010-0051925 | A | | 5/2010 | |
| KR | 20100051933 | A | * | 5/2010 | |
| KR | 10-2011-0042249 | A | | 4/2011 | |
| KR | 10-1436123 | B1 | | 11/2014 | |
| KR | 20150086670 | A | * | 7/2015 | |
| KR | 10-2016-0142673 | A | | 12/2016 | |
| KR | 10-2019-0075869 | A | | 7/2019 | |
| KR | 10-2019-0117413 | A | | 10/2019 | |
| KR | 102199982 | B1 | * | 1/2021 | H10H 20/857 |
| KR | 10-2022-0030424 | A | | 3/2022 | |
| KR | 10-2022-0103251 | A | | 7/2022 | |
| WO | WO 2004/109764 | A2 | | 12/2004 | |
| WO | WO 2020/050468 | A1 | | 3/2020 | |

OTHER PUBLICATIONS

International Search Report issued in corresponding application PCT/KR2021/011617, Dec. 10, 2021, 3 pages.

* cited by examiner

LIGHT-EMITTING ELEMENT, METHOD OF MANUFACTURING LIGHT-EMITTING ELEMENT, AND DISPLAY DEVICE INCLUDING LIGHT-EMITTING ELEMENT

CROSS-REFERENCE TO RELATED APPLICATION

This application claims priority to and the benefit of Korean Patent Application No. 10-2020-0173694, filed in the Korean Intellectual Property Office on Dec. 11, 2020, the entire content of which is incorporated herein by reference.

BACKGROUND

1. Field

Aspects of embodiments of the present disclosure relate to a light-emitting element, a method of manufacturing the light-emitting element, and a display device including the light-emitting element.

2. Description of the Related Art

Recently, as interest in information displays is increasing, research and development for display devices is continuously being conducted.

SUMMARY

Embodiments of the present disclosure provide a light-emitting element, a method of manufacturing the light-emitting element, and a display device including the light-emitting element in which a misarrangement of light-emitting elements is avoided (or substantially avoided) and luminous efficiency is improved.

It should be noted that aspects and features of the present disclosure are not limited to the above-mentioned aspects and features, and other aspects and features of the present disclosure will be clearly understood by those skilled in the art from the following descriptions.

According to an embodiment of the present disclosure, a light-emitting element includes: a first semiconductor layer including a first type semiconductor; a second semiconductor layer including a second type semiconductor different from the first type semiconductor; an active layer between one surface of the first semiconductor layer and one surface of the second semiconductor layer; a first electrode layer on another surface of the second semiconductor layer and having a first cross-sectional area; and a second electrode layer on another surface of the first semiconductor layer and having a second cross-sectional area smaller than the first cross-sectional area. A side surface of the light-emitting element defined by the first semiconductor layer, the active layer, the second semiconductor layer, and the second electrode layer is perpendicular to a main surface of the first electrode layer.

The first electrode layer and the second electrode layer may each include a transparent conductive material.

The transparent conductive material may include any one selected from Transparent Conductive Oxide (TCO) Indium Tin Oxide (ITO), Indium Zinc Oxide (IZO), Aluminum Zinc Oxide (AZO), Gallium-doped Zinc Oxide (GZO), Zinc Tin Oxide (ZTO), Gallium Tin Oxide (GTO), and Fluorine-doped Tin Oxide (FTO).

The first electrode layer may include a transparent conductive material, and the second electrode layer may include a reflective material.

The reflective material may include any one selected from chromium (Cr), titanium (Ti), aluminum (Al), gold (Au), nickel (Ni), an oxide, or alloy thereof.

Each of the first semiconductor layer, the active layer, and the second semiconductor layer may have the second cross-sectional area.

An angle between a generated line of the light-emitting element and the first electrode layer may be 90°.

The light-emitting element may further include an insulating film covering at least a portion of the active layer.

A cross section of each of the second electrode layer, the first semiconductor layer, the active layer, and the second semiconductor layer may have one of a circular shape, an elliptical shape, and a polygonal shape.

According to another embodiment of the present disclosure, a method of manufacturing a light-emitting element includes: sequentially providing an undoped semiconductor layer, a first semiconductor layer, an active layer, a second semiconductor layer, a first electrode layer, and a coupling layer on a stack substrate; separating the stack substrate from the undoped semiconductor layer; separating the undoped semiconductor layer from the first semiconductor layer; positioning a second electrode layer on the first semiconductor layer; performing a first etching process to remove at least a portion of each of the second electrode layer, the first semiconductor layer, the active layer, and the second semiconductor layer in a direction from the first semiconductor layer toward the second semiconductor layer; performing a second etching process to etch a side surface of each of the second electrode layer, the first semiconductor layer, the active layer, and the second semiconductor layer in the direction from the first semiconductor layer toward the second semiconductor layer; and separating the coupling layer from the first electrode layer. The performing of the second etching process includes etching the side surface defined by the first semiconductor layer, the active layer, the second semiconductor layer, and the second electrode layer to be perpendicular to a main surface of the first electrode layer, and the performing of the first etching process includes etching the first electrode layer to have a first cross-sectional area, and etching the second electrode layer to have a second cross-sectional area smaller than the first cross-sectional area.

The performing of the first etching process may include etching each of the first semiconductor layer, the active layer, and the second semiconductor layer to have a cross-sectional area different from the second cross-sectional area.

The performing of the second etching process may include etching each of the first semiconductor layer, the active layer, and the second semiconductor layer to have the second cross-sectional area.

The performing of the second etching process may be performed after the performing of the first etching process.

A laser lift-off method may be used to separate the substrate from the undoped semiconductor layer.

The undoped semiconductor layer may be separated from the first semiconductor layer through an etch back process.

The method may further include forming an insulating film to extend around an outer peripheral surface of the active layer.

The method may further include separating the coupling layer from the second electrode layer.

According to another embodiment of the present disclosure, a display device includes: a substrate; a light-emitting element including a first semiconductor layer including a first type semiconductor, a second semiconductor layer including a second type semiconductor different from the first type semiconductor, an active layer between one surface of the first semiconductor layer and one surface of the second semiconductor layer, a first electrode layer on another surface of the second semiconductor layer and having a first cross-sectional area, and a second electrode layer arranged on another surface of the first semiconductor layer and having a second cross-sectional area; a first contact electrode on the substrate and electrically connected to the second electrode layer of the light-emitting element; and a second contact electrode on the substrate and electrically connected to the first electrode layer of the light-emitting element. The first contact electrode is between the substrate and the second contact electrode, and the second electrode layer is between the substrate and the first electrode layer.

The first contact electrode may include a reflective material, and each of the first electrode layer, the second electrode layer, and the second contact electrode may include a transparent conductive material.

The first electrode layer may include a reflective material, and each of the second contact electrode and the second electrode layer may include a transparent conductive material.

Aspects and features of the present disclosure are not limited to those discussed above, and other aspects and features of the present disclosure will be understood by those having ordinary skill in the art from the disclosure provided below together with accompanying drawings.

BRIEF DESCRIPTION OF THE DRAWINGS

FIGS. 5 to 15 are cross-sectional views of processes of a method of manufacturing a light-emitting element according to an embodiment.

DETAILED DESCRIPTION

Figure 1:
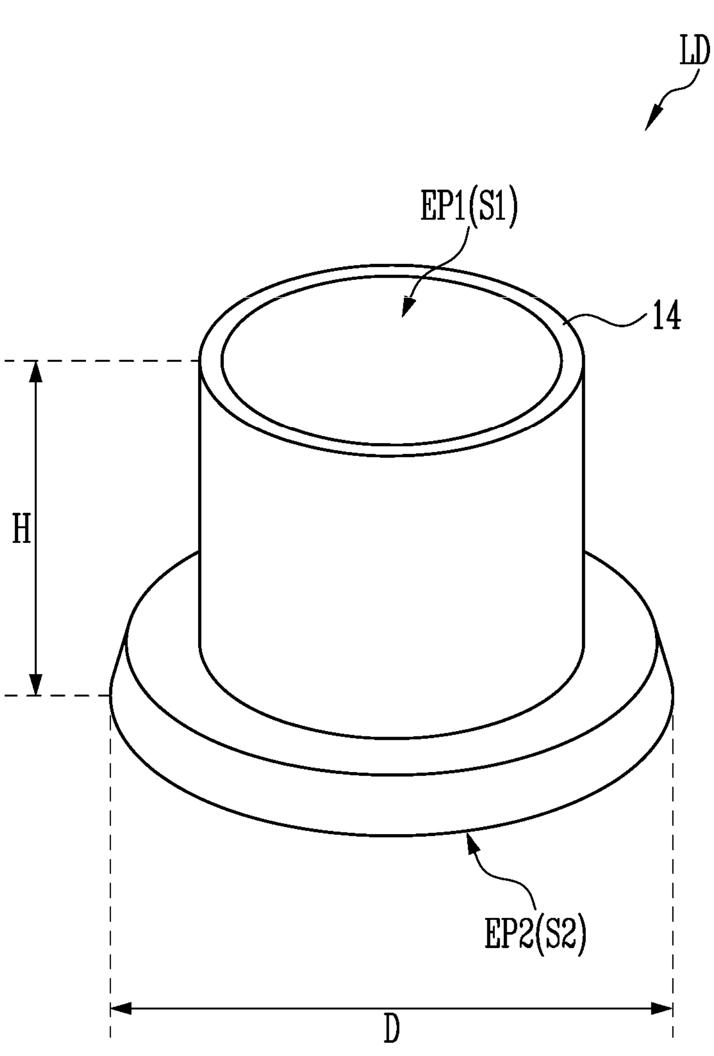
FIGS. 1 and 2 are a perspective and a cross-sectional view, respectively, illustrating a light-emitting element according to an embodiment.

Embodiments described herein are provided to clearly explain the scope of the present disclosure to those having ordinary skill in the art and are not intend to limit the present disclosure. It should be understood that the present disclosure may include substitutions and modifications to the described embodiments within the technical scope of the present disclosure.

The terms used in this specification are selected from general terms, which are widely used currently, based on functions of components according to the embodiment of the present disclosure and may have meanings varying according to the intentions of those skilled in the art, the custom in the field of art or advent of new technology. If a specific term is used with a specific meaning, the meaning of the term will be specifically described. Accordingly, the terms used in this specification should not be defined as simple names of the components but should be defined based on the actual meaning of the terms in the context of the present specification.

The accompanying drawings are to facilitate the explanation of the present disclosure and the shapes in the drawings may be exaggerated for the purpose of convenience of explanation, so the present disclosure should not be limited to the drawings.

In addition, the details of the generally known function(s) and structure(s), may be omitted.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, a light-emitting element, a method of manufacturing the light-emitting element, and a display device including the light-emitting element according to embodiments will be described with reference to FIGS. 1 to 17.

Figure 2:
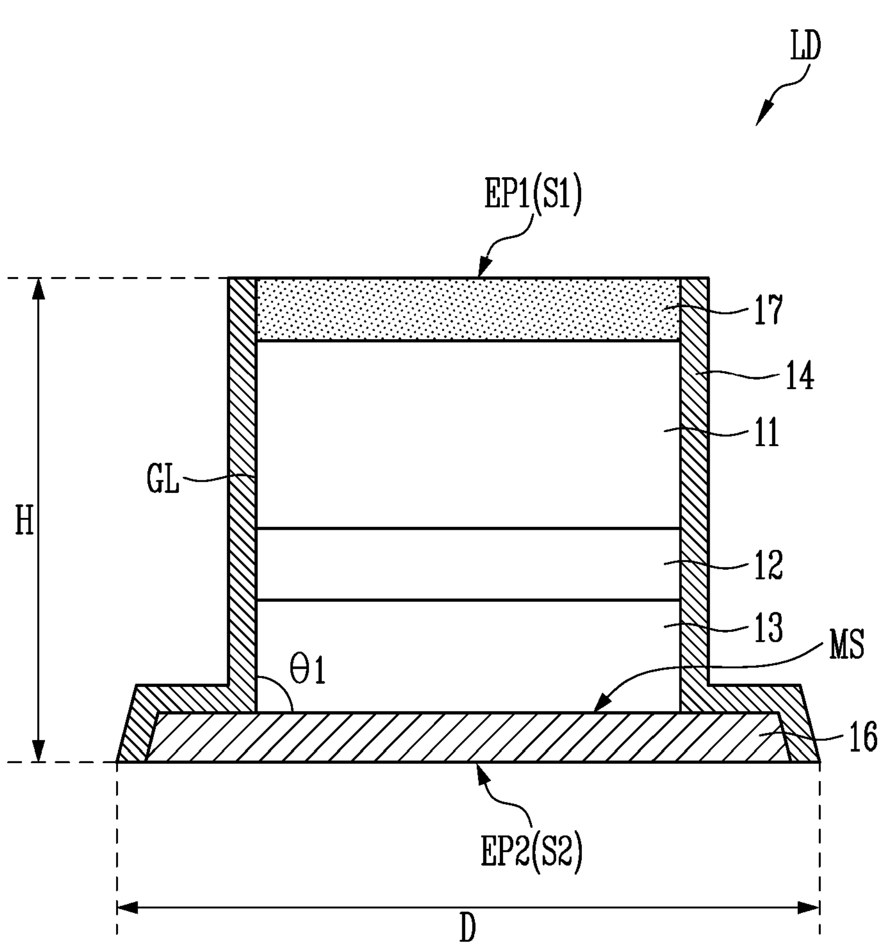
Figure 3:
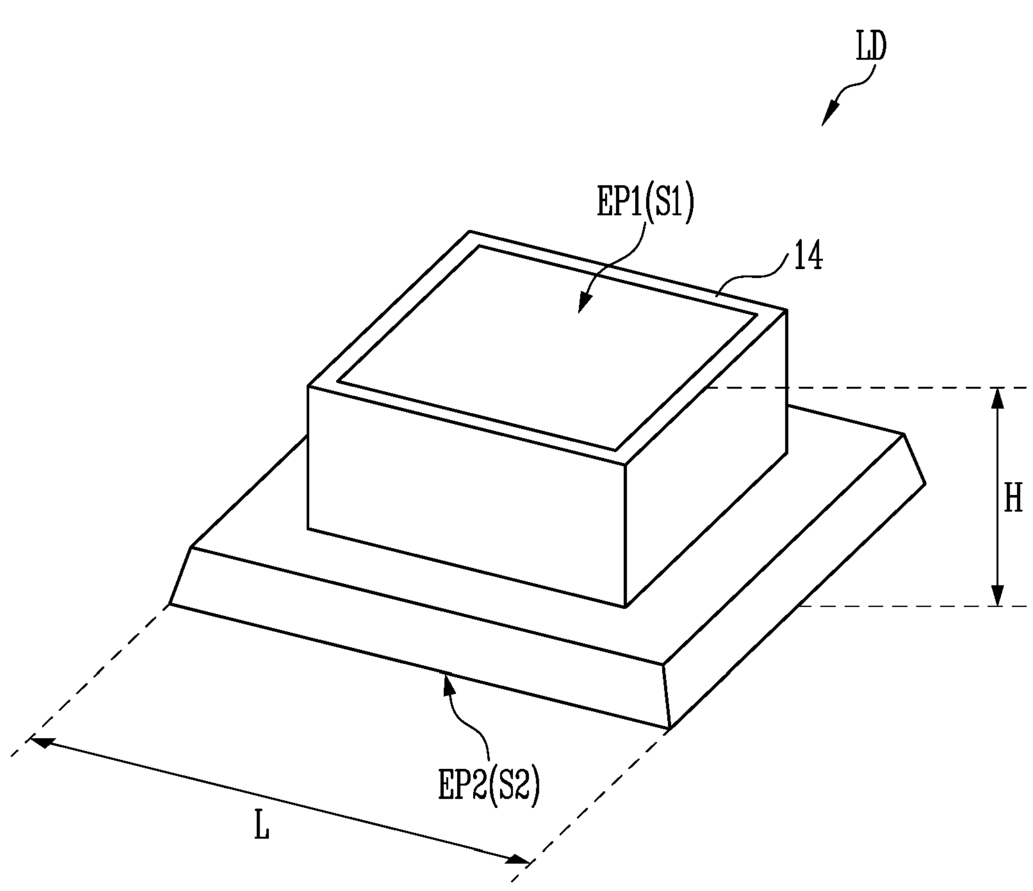
FIGS. 3 and 4 are a perspective and a cross-sectional view, respectively, illustrating a light-emitting element according to another embodiment.
Figure 4:
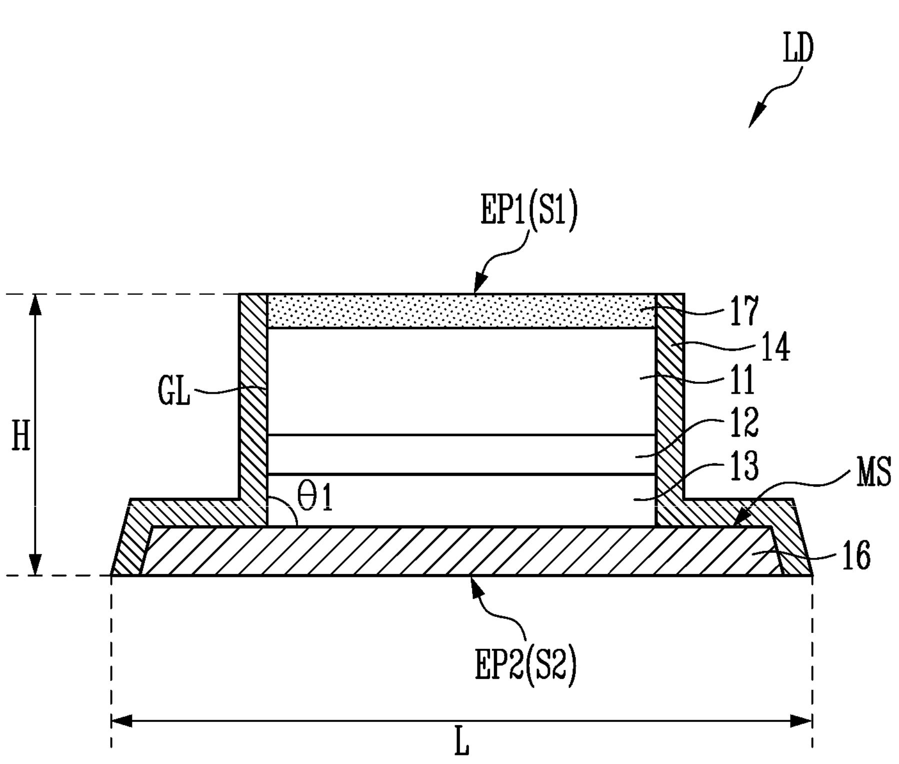

FIGS. 1 and 2 are a perspective and a cross-sectional view, respectively, illustrating a light-emitting element according to an embodiment. FIGS. 3 and 4 are a perspective and a cross-sectional view, respectively, illustrating a light-emitting element according to another embodiment.

Referring to FIGS. 1 to 4, a light-emitting element LD may include a first semiconductor layer 11, an active layer 12, a second semiconductor layer 13, an insulating film 14, a first electrode layer 16, and a second electrode layer 17. The first electrode layer 16, the second semiconductor layer 13, the active layer 12, the first semiconductor layer 11, and the second electrode layer 17 may be sequentially stacked in a direction of a height (e.g., a height direction) H of the light-emitting element LD.

One of the first semiconductor layer 11 and the second semiconductor layer 13 may be disposed at a position adjacent to (or at) a first end EP1 of the light-emitting element LD, and the other of the first semiconductor layer 11 and the second semiconductor layer 13 may be disposed at a position adjacent to (or at) a second end EP2 of the light-emitting element LD.

Hereinafter, for convenience of description, an area corresponding to one end of the light-emitting element LD in which the first semiconductor layer 11 is arranged is defined as the first end EP1, and an area corresponding to the other end of the light-emitting element LD in which the second semiconductor layer 13 is arranged is defined as the second end EP2. Hereinafter, for convenience of description, a surface corresponding to the first end EP1 is defined as a first surface S1 of the light-emitting element LD, and a surface corresponding to the second end EP2 is defined as a second surface S2 of the light-emitting element LD.

The light-emitting element LD may have a size ranging from a nanometer scale to a micrometer scale. However, the size of the light-emitting element LD is not limited thereto and may be variously changed according to design conditions of various devices (e.g., a display device) which use a light-emitting device including the light-emitting element LD as a light source.

The first semiconductor layer 11 may be disposed closer to the first surface S1 than to the second surface S2. The first semiconductor layer 11 may be a first conductivity-type (or type) semiconductor layer. For example, the first semiconductor layer 11 may include an N-type semiconductor layer. As an example, the first semiconductor layer 11 may include an N-type semiconductor layer which includes any one semiconductor material selected from InAlGaN, GaN, AlGaN, InGaN, AlN, and InN and is doped with a first-conductivity type dopant such as silicon (Si), germanium (Ge), tin (Sn), or the like. However, a material included in (or constituting) the first semiconductor layer 11 is not limited thereto, and the first semiconductor layer 11 may include (or may be made of) various suitable materials.

The active layer 12 may be disposed on the first semiconductor layer 11 and may be formed to have a single-quantum well or multi-quantum well structure. The position of the active layer 12 may be variously changed according to the type of the light-emitting element LD. As an example, the first semiconductor layer 11 of the light-emitting elements LD may be implemented as a plurality of layers, and the active layer 12 may be disposed between the plurality of first semiconductor layers 11.

A clad layer doped with a conductive dopant may be formed on and/or under the active layer 12. As an example, the clad layer may (or may be formed as) an AlGaN layer or an InAlGaN layer. According to embodiments, a material, such as AlGaN or InAlGaN, may include (or may be used to form) the active layer 12, and in addition, various suitable materials may be included in (or may constitute) the active layer 12.

The second semiconductor layer 13 is disposed on the active layer 12 and may include a semiconductor layer that has a different conductivity-type (or type) from the first semiconductor layer 11. The second semiconductor layer 13 may be disposed closer to the second surface S2 than to the first surface S1. For example, the second semiconductor layer 13 may include a P-type semiconductor layer. As an example, the second semiconductor layer 13 may include a P-type semiconductor layer which includes any one semiconductor material selected from InAlGaN, GaN, AlGaN, InGaN, AlN, and InN and is doped with a second-conductivity type dopant, such as magnesium (Mg). However, a material included in (or constituting) the second semiconductor layer 13 is not limited thereto, and the second semiconductor layer 13 may include (or may be made of) various suitable materials.

Hereinafter, for convenience, descriptions will be given based on an embodiment in which the first semiconductor layer 11 includes an N-type semiconductor layer and the second semiconductor layer 13 includes a P-type semiconductor layer.

When a voltage greater than or equal to a threshold voltage is applied to both ends (e.g., opposite ends) of the light-emitting element LD, electrons and holes are combined with each other in the active layer 12, and thus, light may be provided from (or emitted by) the active layer 12. Accordingly, the light-emitting element LD emits light. By controlling light emission of the light-emitting element LD using such a principle, the light-emitting element LD may be used as a light source for various light-emitting devices, including pixels of a display device.

The insulating film 14 may be formed on a surface of the light-emitting element LD to surround (e.g., to extend around a periphery of) an outer surface of the active layer 12 at least. In addition, the insulating film 14 may surround at least a partial area of each of the first semiconductor layer 11, the second semiconductor layer 13, the first electrode layer 16, and the second electrode layer 17.

The insulating film 14 may include a transparent insulating material. According to an example, the insulating film 14 may be formed as a single-layer or may have a multi-layer structure including at least one insulating material selected from silicon oxide ($SiO_x$), silicon nitride ($SiN_x$), silicon oxynitride ($SiO_xN_y$), aluminum oxide ($AlO_x$), and titanium oxide ($TiO_x$) (e.g., a double layer made of aluminum oxide ($AlO_x$) and silicon oxide ($SiO_x$)). However, the present disclosure is not limited thereto, and the insulating film 14 may be omitted according to embodiments.

The first electrode layer 16 may be formed on the second semiconductor layer 13. For example, the first electrode layer 16 may be disposed on one surface of the second semiconductor layer 13, and the active layer 12 may be disposed on the other surface of the second semiconductor layer 13.

The first electrode layer 16 may include a transparent conductive material. According to an example, the first electrode layer 16 may include a transparent conductive material, such as at least one transparent conductive oxide selected from Transparent Conductive Oxide (TCO), Indium Tin Oxide (ITO), Indium Zinc Oxide (IZO), Aluminum Zinc Oxide (AZO), Gallium-doped Zinc Oxide (GZO), Zinc Tin Oxide (ZTO), Gallium Tin Oxide (GTO), and Fluorine-doped Tin Oxide (FTO), but the present disclosure is not limited to the above-described example.

The second electrode layer 17 may be formed on the first semiconductor layer 11. For example, the second electrode layer 17 may be disposed on one surface of the first semiconductor layer 11, and the active layer 12 may be disposed on the other (e.g., the opposite) surface of the first semiconductor layer 11.

The second electrode layer 17 may include a translucent conductive material. The second electrode layer 17 may include a reflective material. The reflective material may have a reflectance of 90% or more. According to an example, the second electrode layer 17 may include at least one selected from chromium (Cr), titanium (Ti), aluminum (Al), gold (Au), nickel (Ni), and an oxide or alloy thereof, but the present disclosure is not limited to the above-described example.

However, according to embodiments, the second electrode layer 17 may include a transparent conductive material. According to an example, similar to the first electrode layer 16, the second electrode layer 17 may include a transparent conductive material, such as at least one transparent conductive oxide selected from transparent conductive oxide (TCO), Indium Tin Oxide (ITO), Indium Zinc Oxide (IZO), Aluminum Zinc Oxide (AZO), Gallium-doped Zinc Oxide (GZO), Zinc Tin Oxide (ZTO), Gallium Tin Oxide (GTO), and Fluorine-doped Tin Oxide (FTO), but the present disclosure is not limited to the above-described example.

The second electrode layer 17 and the first electrode layer 16 may be ohmic electrodes, but the present disclosure is not limited thereto. The second electrode layer 17 and the first electrode layer 16 may be Schottky electrodes.

The first end EP1 and the second end EP2 of the light-emitting element LD may have different polarities. At least one of the first end EP1 and the second end EP2 of the light-emitting element LD may be exposed, and the first end EP1 and/or the second end EP2 of the light-emitting element LD may be electrically connected to external components.

Each of the first surface S1 and the second surface S2 of the light-emitting element LD may have any one shape from among a circular shape, an elliptical shape, and a polygonal shape. Each of the first surface S1 and the second surface S2 of the light-emitting element LD according to one embodiment may have a circular shape or an elliptical shape. The first surface S1 of the light-emitting element LD according to another embodiment may have an n-gonal shape (wherein n is an integer greater than three), and the second surface S2 of the light-emitting element LD may have an n-gonal shape that is similar to an upper surface (e.g., the first surface S1). In some embodiments, the shape of the first surface S1 and the second surface S2 of the light-emitting element LD may be any one of a rectangle, a square, a regular triangle, a regular triangle, a regular pentagon, and a regular octagon but is not limited to these examples.

Referring to FIGS. 1 and 2, the first surface S1 of the light-emitting element LD and the second surface S2 of the light-emitting element LD according to an embodiment may have circular shapes having different areas. Referring to FIGS. 3 and 4, the first surface S1 of the light-emitting element LD and the second surface S2 of the light-emitting element LD according to another embodiment may have rectangular shapes having different areas.

An area of the first surface S1 of the light-emitting element LD may be smaller than an area of the second surface S2 of the light-emitting element LD. An area of the second electrode layer 17 may be smaller than an area of the first electrode layer 16. As an example, the first surface S1 may have a first area, and the second surface S2 may have a second area greater than the first area. For example, based on the direction of the height H, an area of the upper surface of the light-emitting element LD may be different from an area of a lower surface of the light-emitting element LD.

According to an embodiment, the height H of the light-emitting element LD may be smaller than a diameter D of the first electrode layer 16. According to another embodiment, the height H of the light-emitting element LD may be smaller than a length L of one side of the first electrode layer 16.

According to embodiments, when a display device is manufactured, the misalignment of the light-emitting elements LD can be prevented or mitigated. For example, when a cross-sectional area of the second surface S2 is greater than a cross-sectional area of the first surface S1, the probability that the first surface S1 of the light-emitting element LD faces downwardly may be greater than the probability that the second surface S2 of the light-emitting element LD faces downwardly when the light-emitting elements LD are arranged, and thus, the light-emitting element LD may be predominantly arranged in a form in which the first surface S1 faces downward.

A cross-sectional area of the first semiconductor layer 11, a cross-sectional area of the active layer 12, and a cross-sectional area of the second semiconductor layer 13 may be substantially the same. A line (or surface) defined by a side surface of the light-emitting element LD and the second surface S2 of the light-emitting element LD may form an angle of a first angle 81. The side surface of the light-emitting element LD may be defined by the first semiconductor layer 11, the active layer 12, the second semiconductor layer 13, and the second electrode layer 17.

According to an embodiment, the side surface of the light-emitting element LD may be perpendicular to a main surface MS of the first electrode layer 16. The first angle 81 may be an angle between a generated line GL of the light-emitting element LD and the second surface S2. In this embodiment, the first angle 81 may be in a range of about 85° to about 90°. The first angle 81 may be substantially 90°. The generated line GL of the light-emitting element LD may form an angle of about 90° with the first electrode layer 16.

A light-emitting device including the light-emitting element LD described above may be used in various types of devices, including a display device, which requires a light source. For example, the light-emitting element LD may be disposed in each pixel of a display panel, and the light-emitting element LD may be used as a light source of each pixel. However, an application field of the light-emitting element LD is not limited to the above-described example. For example, the light-emitting element LD may be used in other types of devices, such as a lighting device, which uses (or includes) a light source (e.g., which does not include another light source).

Hereinafter, a method of manufacturing a light-emitting element according to embodiments will be described in detail with reference to FIGS. 5 to 15.

FIGS. 5 to 15 are cross-sectional views of processes of the method of manufacturing a light-emitting element according to the embodiments.

Figure 5:
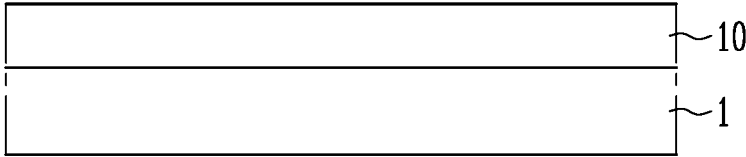

Referring to FIG. 5, a stack substrate 1 may be provided, and an undoped semiconductor layer 10 may be formed on the stack substrate 1.

The stack substrate 1 may be a base plate for stacking a target material. The stack substrate 1 may be a wafer for epitaxial-growing a certain material. According to an example, the stack substrate 1 may be any one of a sapphire substrate, a GaAs substrate, a Ga substrate, and an InP substrate but is not limited thereto. For example, when a specific material satisfies selectivity for manufacturing a light-emitting element LD and a certain material may be smoothly epitaxial-grown, the specific material may be selected as a material of the stack substrate 1. A surface of the stack substrate 1 may be flat. A shape of the stack substrate 1 may be a polygonal shape having a rectangle or a circular shape but is not limited thereto.

The undoped semiconductor layer 10 may be a semiconductor layer to which a dopant is not provided. According to an embodiment, the undoped semiconductor layer 10 may include any one semiconductor material selected from InAlGaN, GaN, AlGaN, InGaN, AlN, and InN, but a separate dopant may not be provided to the undoped semiconductor layer 10. An etch ratio of the undoped semiconductor layer 10 to which a dopant is not provided may be different from an etch ratio of a first semiconductor layer 11.

The undoped semiconductor layer 10 may be formed through any one method of a metal-organic chemical vapor phase deposition (MOCVD) method, a molecular beam epitaxy (MBE) method, a vapor phase epitaxy (VPE) method, a liquid phase epitaxy (LPE) method, and the like.

A sacrificial layer may be provided between the stack substrate 1 and the undoped semiconductor layer 10. During a manufacturing process of the light-emitting element LD, the sacrificial layer may separate the stack substrate 1 and the undoped semiconductor layer 10 from each other. The sacrificial layer may include any one selected from GaAs, AlAs, and AlGaAs, but the present disclosure is not limited thereto.

Figure 6:
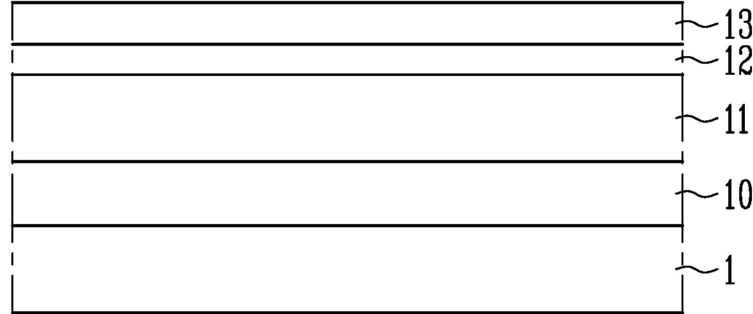

Referring to FIG. 6, the first semiconductor layer 11 is formed on the undoped semiconductor layer 10, an active layer 12 may be formed on the first semiconductor layer 11, and a second semiconductor layer 13 may be formed on the active layer 12. The first semiconductor layer 11, the active layer 12, and the second semiconductor layer 13 may be provided through epitaxial growth and may be provided through any one of among the example methods described above as the methods of forming methods the undoped semiconductor layer 10.

As described above, the first semiconductor layer 11 and the second semiconductor layer 13 may be provided as different types of semiconductor layers. As a result, the active layer 12 may be positioned between the first semiconductor layer 11 and the second semiconductor layer 13 having different polarities, and when electrical information having a threshold voltage or higher is provided to both ends of the light-emitting element LD, light may be emitted from the active layer 12.

Figure 7:
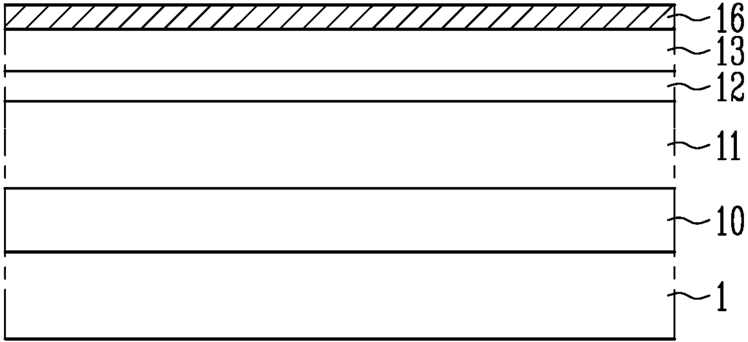

Referring to FIG. 7, a first electrode layer 16 may be formed on the second semiconductor layer 13. According to an example, the first electrode layer 16 may be deposited on the second semiconductor layer 13 through a deposition process. The first electrode layer 16 may include at least one selected from the materials exemplarily listed above with reference to FIGS. 1 to 4.

Figure 8:
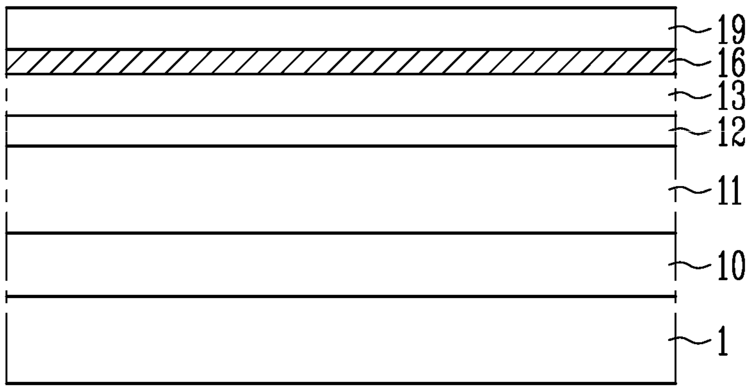

Referring to FIG. 8, a coupling layer 19 may be arranged on the first electrode layer 16. The coupling layer 19 may include a coupling substrate and a connection electrode layer. In this embodiment, the coupling substrate may be a silicon wafer substrate but is not limited thereto. The connection electrode layer may be provided by being applied on the coupling substrate. The coupling layer 19 may be disposed such that the connection electrode layer faces the first electrode layer 16. Thereafter, the connection electrode layer and the first electrode layer 16 may be coupled to each other under temperature and pressure conditions (e.g., predetermined temperature and pressure conditions), and thus, the coupling layer 19 may be positioned on the first electrode layer 16. According to embodiments, an insulating film may be arranged on the first electrode layer 16, and the insulating film may be connected to the connection electrode layer of the coupling layer 19.

Figure 9:
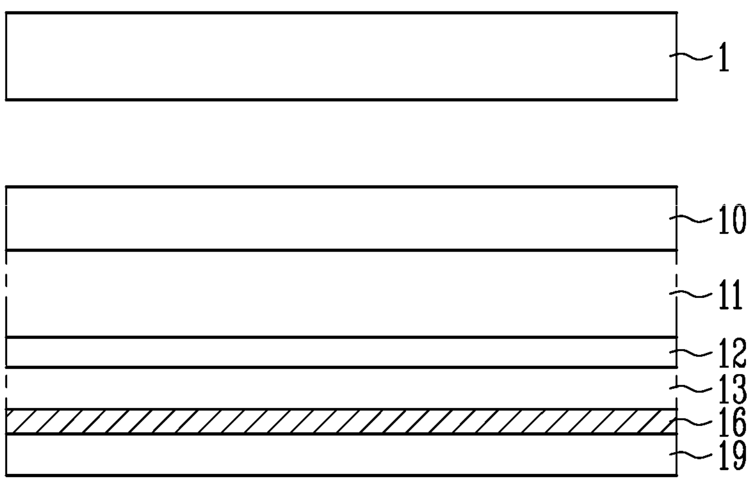

Referring to FIG. 9, the stack substrate 1 may be separated from the undoped semiconductor layer 10. The stack substrate 1 and the undoped semiconductor layer 10 may be separated through a laser lift-off (LLO) method. However, the present disclosure is not limited thereto, and according to other embodiments, the undoped semiconductor layer 10 and the first semiconductor layer 11 may be separated through a chemical lift-off (CLO) method.

Figure 10:
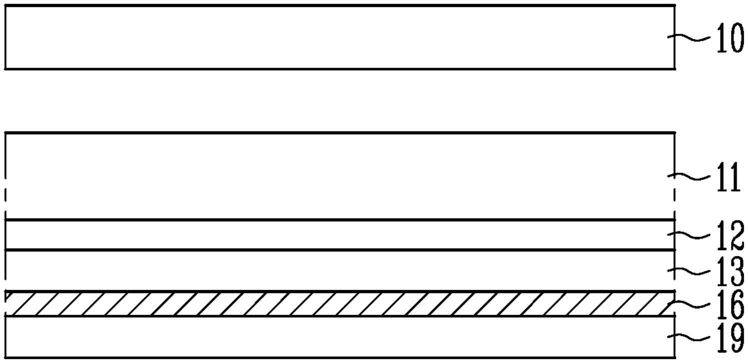

Thereafter, referring to FIG. 10, the undoped semiconductor layer 10 may be separated from the first semiconductor layer 11. An etch ratio of the undoped semiconductor layer 10 may be different from an etch selectivity of the first semiconductor layer 11. As an example, the undoped semiconductor layer 10 may have a first etch ratio, and the first semiconductor layer 11 may have a second etch ratio different from the first etch ratio. An etch back process may be performed using (or based on) a difference between the first etch ratio and the second etch ratio. The etch back process may be performed in an area between the undoped semiconductor layer 10 and the first semiconductor layer 11, and thus, the undoped semiconductor layer 10 and the first semiconductor layer 11 may be separated without performing a separate photo process.

Figure 11:
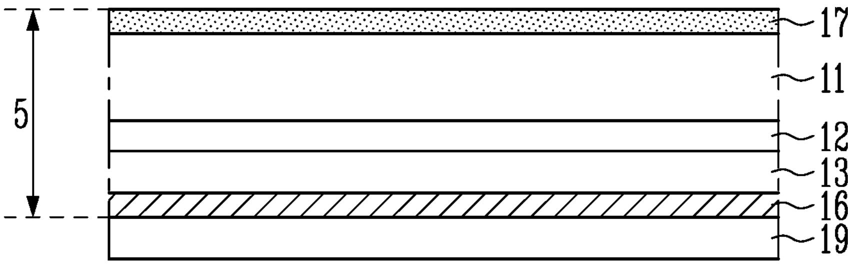

Referring to FIG. 11, a second electrode layer 17 may be arranged on the first semiconductor layer 11. Similar to the first electrode layer 16, the second electrode layer 17 may be stacked on the first semiconductor layer 11 through a deposition process. The second electrode layer 17 may include at least one selected from the example materials described above with reference to FIGS. 1 to 4.

As described above, the second electrode layer 17, the first semiconductor layer 11, the active layer 12, the second semiconductor layer 13, and the first electrode layer 16, which are sequentially stacked on each other, may constitute a light-emitting stack structure 5.

Figure 12:
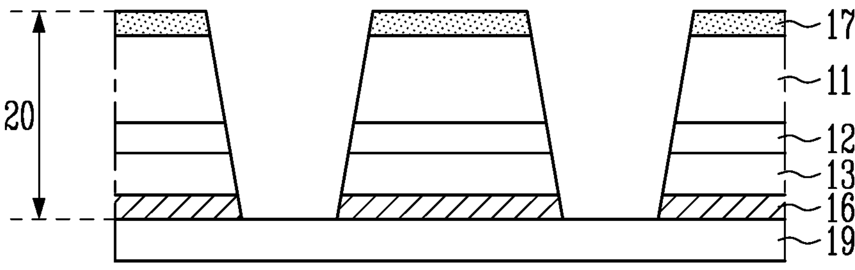

Referring to FIG. 12, a first etching process may be performed on the light-emitting stack structure 5. The light-emitting stack structure 5 may be etched in a stacking direction to form a light-emitting stack pattern 20. The light-emitting stack pattern 20 may correspond to a range removed through etching in the stacking direction. The stacking direction may be a direction perpendicular to a main surface of the coupling layer 19.

To form the light-emitting stack pattern 20, a mask may be disposed on an entire surface of the light-emitting stack structure 5 and an etching process may be performed to pattern at an interval of a nanometer-scale or micrometer scale. An etching mask pattern in which at least one of a circular shape, an elliptical shape, and an n-gonal shape (wherein n is an integer of three or more) is periodically arranged when viewed in a plan view may be used to perform the etching process on the light-emitting stack structure 5. When the light-emitting stack structure 5 is etched in the stacking direction using the formed etching mask pattern, the light-emitting stack pattern 20 may be provided.

Subsequently, the second electrode layer 17, the first semiconductor layer 11, the active layer 12, the second semiconductor layer 13, and the first electrode layer 16 may have different cross-sectional areas. The cross-sectional areas of surfaces of the light-emitting stack pattern 20 parallel to the main surface of the coupling layer 19 may decrease as a distance from the coupling layer 19 is increased. For example, an area of the first electrode layer 16 contacting the coupling layer 19 may be different from an area of the second electrode layer 17 exposed to the outside. The cross-sectional area of the first semiconductor layer 11 may be different from the cross-sectional area of the second semiconductor layer 13.

Figure 13:
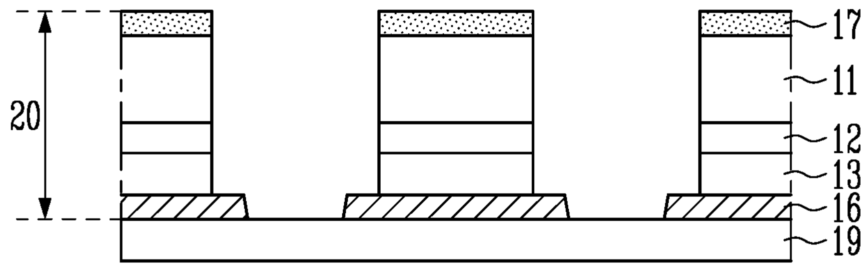

Thereafter, referring to FIG. 13, a second etching process may be performed on the second electrode layer 17, the first semiconductor layer 11, the active layer 12, and the second semiconductor layer 13. The second etching process may not be performed on the first electrode layer 16. The second etching process may be wet etching using a KOH solution but is not limited thereto. The second etching process may be performed after the first etching process.

In one embodiment, the second etching process may be performed so that side surfaces of the second electrode layer 17, the first semiconductor layer 11, the active layer 12, and the second semiconductor layer 13 may be parallel to the stacking direction. The side surfaces of the second electrode layer 17, the first semiconductor layer 11, the active layer 12, and the second semiconductor layer 13 may be perpendicular to the main surface of the coupling layer 19.

After the second etching process is performed, surfaces of the second electrode layer 17, the first semiconductor layer 11, the active layer 12, and the second semiconductor layer perpendicular to the stacking direction may have the same (or substantially the same) cross-sectional area.

In the light-emitting stack pattern 20, surfaces of the second electrode layer 17, the first semiconductor layer 11, the active layer 12, and the second semiconductor layer 13 parallel to the main surface of the coupling layer 19 may have the same cross-sectional area.

After the first etching process described above with reference to FIG. 12 is performed, some cross-sectional areas of the light-emitting stack pattern 20 may be different. Because surface defects and/or damaged surfaces are present on an etched surface, the luminous efficiency of the light-emitting element LD may be reduced. However, the second etching process described above with reference to FIG. 12 may be performed, and the side surfaces of the second electrode layer 17, the first semiconductor layer 11, the active layer 12, and the second semiconductor layer 13 may be at least partially removed. Accordingly, surface defects present on an etched surface may be reduced or removed, damaged etch surfaces may be reduced, and eventually, the luminous efficiency of the resulting light-emitting element LD may be improved.

Figure 14:
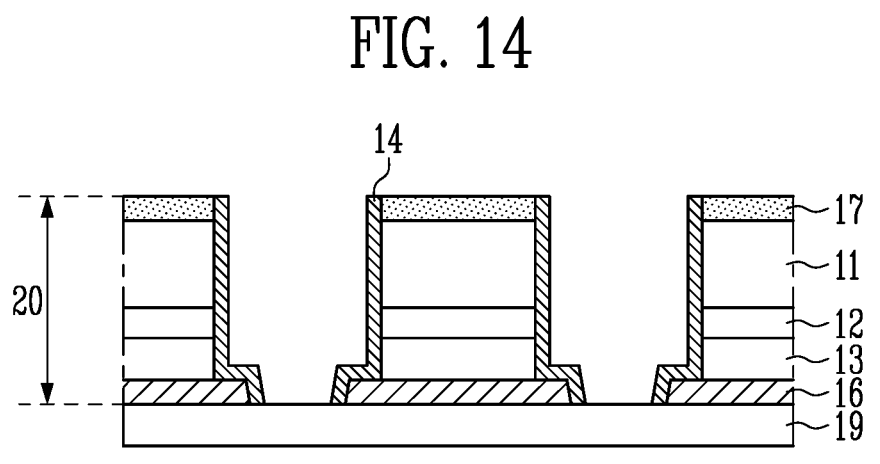

Subsequently, referring to FIG. 14, an insulating film 14 may be provided. The insulating film 14 may be provided by applying an insulating material on the light-emitting stack pattern 20. According to an embodiment, the insulating film 14 may be formed using an atomic layer deposition (ALD) method, a sol-gel process, or a chemical vapor deposition method (e.g., a plasma enhanced chemical vapor deposition (PECVD) method), but the present disclosure is not limited thereto.

In one embodiment, the insulating film 14 may cover the first semiconductor layer 11, the active layer 12, the second semiconductor layer 13, and the first electrode layer 16. After the insulating film 14 is arranged on one surface of the second electrode layer 17, the insulating film 14 may be removed through a separate process. Accordingly, at least a portion of the second electrode layer 17 may be exposed to the outside. However, according to embodiments, a process of forming the insulating film 14 may be omitted, or the insulating film 14 may be provided as a plurality of layers.

Figure 15:
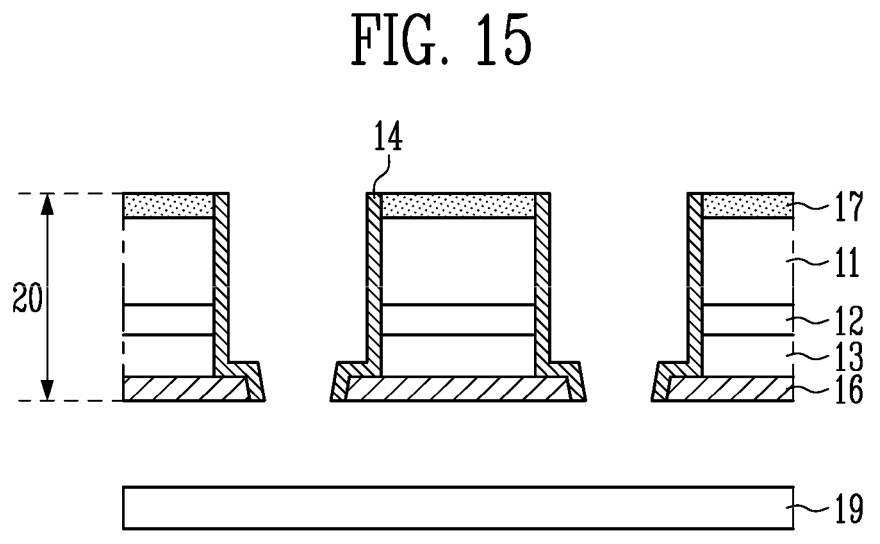

Referring to FIG. 15, the coupling layer 19 may be removed. The light-emitting stack pattern 20 may be separated from the coupling layer 19 to provide the light-emitting element LD described above with reference to FIGS. 1 to 4. According to embodiments, after the coupling layer 19 is removed, a process of removing impurities present on an outer surface of the light-emitting element LD may be further performed, but the present disclosure is not limited thereto.

Thereafter, the light-emitting element LD may be dispersed in a solvent so that an ink including the light-emitting element LD and the solvent may be prepared.

Hereinafter, a display device including a light-emitting element LD according to embodiments will be described with reference to FIGS. 16 and 17.

Figure 16:
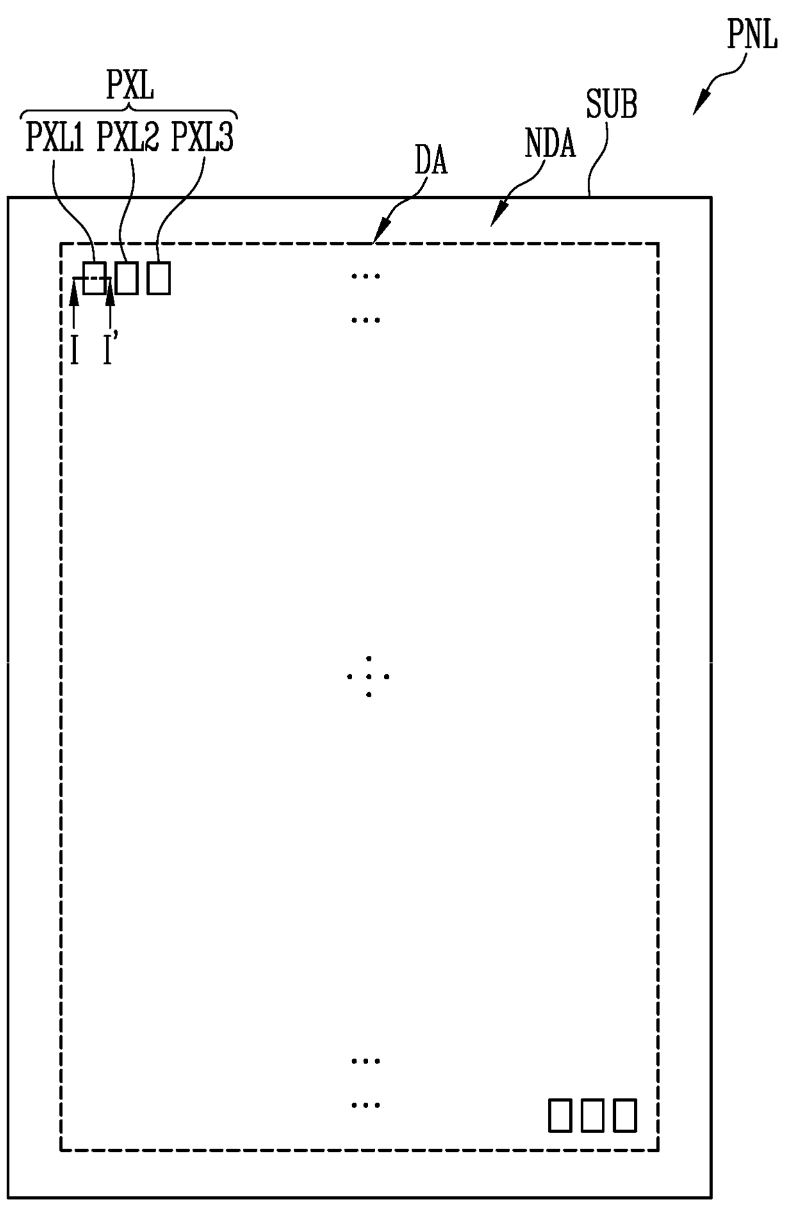
FIG. 16 is a plan view illustrating a display device including a light-emitting element according to an embodiment.
Figure 16:
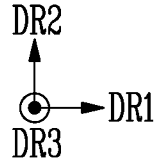

FIG. 16 is a plan view illustrating a display device including a light-emitting element according to embodiments.

As an example of an electronic device which may use the light-emitting elements LD as light sources, a display device, in particular, a display panel PNL included in the display device is illustrated in FIG. 16. For convenience, the structure of the display panel PNL is schematically illustrated in FIG. 16 based on a display area DA. However, in embodiments, at least one driving circuit unit (e.g., at least one of a scan driver and a data driver), lines, and/or pads may be further disposed on the display panel PNL.

Referring to FIG. 16, the display panel PNL may include a substrate SUB and pixels PXL disposed on the substrate SUB. The plurality of pixels PXL may be provided on the substrate SUB.

The substrate SUB may be (or may constitute) a base member of the display panel PNL and may be a rigid or flexible substrate or film.

The display panel PNL and the substrate SUB for forming the same may include the display area DA for displaying an image and a non-display area NDA excluding the display area DA.

The pixels PXL may be disposed in the display area DA. The pixel PXL may include the light-emitting element LD. Various lines, pads, and/or an embedded circuit unit connected to the pixels PXL of the display area DA may be disposed in the non-display area NDA. The pixels PXL may be regularly arranged according to a stripe or PenTile® (a registered trademark of Samsung Display Co., Ltd.) (e.g., a diamond) arrangement structure. However, the arrangement structure of the pixels PXL is not limited thereto, and the pixels PXL may be arranged in the display area DA in various structures and/or manners.

According to embodiments, two or more types of pixels PXL emitting light having different colors may be disposed in the display area DA. As an example, the pixels PXL may include first pixels PXL1 emitting first color light, second pixels PXL2 emitting second color light, and third pixels PXL3 emitting third color light. At least one first pixel PXL1, at least one second pixel PXL2, and at least one third pixel PXL3 disposed adjacent to each other may form (or may constitute) one pixel unit configured to emit light having various colors. For example, the first to third pixels PXL1, PXL2, and PXL3 may be subpixels which each emit light having a predetermined color. According to embodiments, the first pixel PXL1 may be a red pixel which emits red light, the second pixel PXL2 may be a green pixel which emits green light, and the third pixel PXL3 may be a blue pixel which emits blue light, but the present disclosure is not limited thereto.

In one embodiment, the first pixel PXL1, the second pixel PXL2, and the third pixel PXL3 may respectively include a first color light-emitting element, a second color light-emitting element, and a third color light-emitting element as a light source to respectively emit the first color light, the second color light, and the third color light. In another embodiment, the first pixel PXL1, the second pixel PXL2, and the third pixel PXL3 may include light-emitting elements which emit the same color light. In addition, the first pixel PXL1, the second pixel PXL2, and the third pixel PXL3 may include color conversion layers and/or color filters having different colors, which are disposed on the light-emitting elements, to emit the first color light, the second color light, and the third color light. However, the color, type, and/or number of the pixels PXL constituting each pixel unit are not particularly limited. For example, the color of light emitted by each pixel PXL may be variously changed.

The pixel PXL may include at least one light source driven by control signals (e.g., a scan signal and a data signal) and/or power sources (e.g., a first power source and a second power source). In one embodiment, each pixel PXL may be formed as an active pixel. However, the type, structure, and/or driving method of the pixels PXL applicable to the display device are not particularly limited. For example, each pixel PXL having various suitable structures and/or driving methods may be formed as a pixel of a passive or active light-emitting display device.

Figure 17:
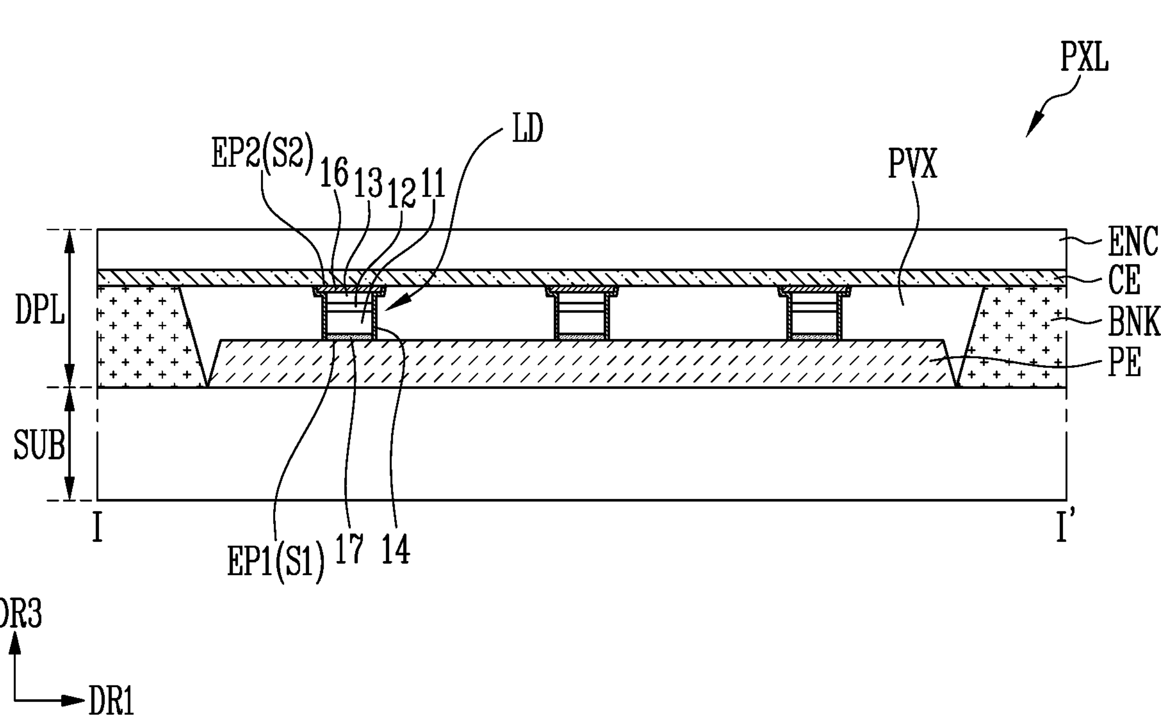
FIG. 17 is a cross-sectional view taken along the line I-I' of FIG. 16.

FIG. 17 is a cross-sectional view taken along the line I-I' of FIG. 16. In FIG. 17, the structure of the pixel PXL is schematically illustrated. In FIG. 17, for convenience of description, a transistor connected to the light-emitting element LD and lines connected to the transistor are omitted.

Referring to FIG. 17, the pixel PXL may include a substrate SUB and a display element part PCL.

The substrate SUB may be a rigid or flexible substrate. According to an example, the substrate SUB may include a rigid material or a flexible material. However, the material of the substrate SUB is not limited to a specific example.

The display element part DPL may be positioned on the substrate SUB. The display element part DPL may include a pixel electrode PE, the light-emitting element LD, a connection electrode CE, a protective layer PVX, a bank BNK, and an encapsulation layer ENC. The pixel electrode PE may be referred to as a first contact electrode with respect to the light-emitting element LD, and the connection electrode CE may be referred to as a second contact electrode with respect to the light-emitting element LD.

The pixel electrode PE may be disposed on the substrate SUB. The pixel electrode PE may be an anode. The pixel electrode PE may include at least a conductive material. According to an example, the pixel electrode PE may include a reflective conductive material, and thus, light emitted by the light-emitting element LD toward the pixel electrode PE may travel in a display direction of the light-emitting element LD (e.g., a third direction DR3).

According to an example, the pixel electrode PE may include copper (Cu), gold (Au), silver (Ag), magnesium (Mg), aluminum (Al), platinum (Pt), lead (Pb), nickel (Ni), neodymium (Nd), iridium (Ir), chromium (Cr), lithium (Li), calcium (Ca), or a mixture thereof and may include Indium Tin Oxide (ITO), Indium Zinc Oxide (IZO), Zinc Oxide (ZnO), or Indium Oxide ($In_2O_3$), but the present disclosure is not limited thereto.

At least a portion of the connection electrode CE may be disposed on the substrate SUB, and at least another portion of the connection electrode CE may be disposed to be electrically connected to one end of the light-emitting element LD. The connection electrode CE may be provided in the form of a plate on the display area DA, but the present disclosure is not limited thereto.

The connection electrode CE may include a transparent conductive material (or substance), such as one transparent conductive oxide selected from Indium Tin Oxide (ITO), Indium Zinc Oxide (IZO), Aluminum Zinc Oxide (AZO), Gallium-doped Zinc Oxide (GZO), Zinc Tin Oxide (ZTO), Gallium Tin Oxide (GTO), and Fluorine-doped Tin Oxide (FTO). In other embodiments, the connection electrode CE may include a semi-transparent conductive material (or substance), such as magnesium (Mg), silver (Ag), or an alloy of magnesium (Mg) and silver (Ag).

An electric signal may flow between the pixel electrode PE and the connection electrode CE, and when the electric signal flows, the light-emitting element LD may emit light. For example, an electric signal may flow in the light-emitting element LD in a direction from a first end EP1 toward a second end EP2 or from the second end EP2 toward the first end EP1.

A polarity of the pixel electrode PE may be different from a polarity of the connection electrode CE. For example, when the pixel electrode PE is a cathode, the connection electrode CE may be an anode, and when the pixel electrode PE is an anode, the connection electrode CE may be a cathode. Hereinafter, description will be given based on the pixel electrode PE being an anode and the connection electrode CE being a cathode.

The pixel electrode PE and the connection electrode CE may be disposed to be separated and spaced apart from each other. The pixel electrode PE may provide an electric signal provided from a transistor to the light-emitting element LD.

The light-emitting element LD may emit light when an electrical signal is provided. The light-emitting element LD may output light in the display direction (e.g., the third direction DR3). The light-emitting element LD may be arranged on the pixel electrode PE.

The light-emitting element LD may be arranged such that the first end EP1 of the light-emitting element LD faces the pixel electrode PE. The light-emitting element LD may be arranged such that the second end EP2 of the light-emitting element LD faces the connection electrode CE. The first end EP1 of the light-emitting element LD may be electrically connected to the pixel electrode PE, and the second end EP2 of the light-emitting element LD may be electrically connected to the connection electrode CE. For example, a second semiconductor layer 13 of the light-emitting element LD may be electrically connected to the connection electrode CE, and a first semiconductor layer 11 of the light-emitting element LD may be electrically connected to the pixel electrode PE.

At least a portion of a first surface S1 of the light-emitting element LD may be in physical contact with the pixel electrode PE. At least a portion of a second surface S2 of the light-emitting element LD may be in physical contact with the connection electrode CE.

The first surface S1 of the light-emitting element LD may be connected to the pixel electrode PE to form a contact area, and the second surface S2 of the light-emitting element LD may be connected to the connection electrode CE to form a contact area at least greater than the contact area between the first surface S1 and the pixel electrode PE. For example, a contact area between the first electrode layer 16 of the light-emitting element LD and the connection electrode CE may be greater than a contact area between the second electrode layer 17 of the light-emitting element LD and the pixel electrode PE.

According to one embodiment, the first electrode layer 16 of the light-emitting element LD may include a transparent conductive material, and the second electrode layer 17 of the light-emitting element LD may include a reflective material to be arranged on the pixel electrode PE. In this embodiment, light emitted from the light-emitting element LD may be reflected in the display direction (e.g., the third direction DR3) by the second electrode layer 17, thereby improving the luminous efficiency of the light-emitting element LD.

According to another embodiment, the first electrode layer 16 and the second electrode layer 17 of the light-emitting element LD may include a transparent conductive material, and the pixel electrode PE may include a reflective material. In this embodiment, the pixel electrode PE reflects light emitted from the light-emitting element LD in the display direction, thereby improving the luminous efficiency of the light-emitting element LD.

The protective layer PVX may be disposed to surround (e.g., to extend around a periphery of) the light-emitting elements LD. The protective layer PVX may remove a step difference due to the light-emitting element LD or the like. The protective layer PVX may include an organic insulating material, such as a polyacrylate-based resin, an epoxy resin, a phenolic resin, a polyimide-based resin, a polyimide-based resin, an unsaturated polyester-based resin, a poly phenylethene-based resin, a polyphenylene sulfide-based resin, or benzocyclobutene (BCB), but the present disclosure is not necessarily limited thereto.

The bank BNK may have a shape protruding in the display direction (e.g., the third direction DR3). The pixel electrode PE may be arranged between adjacent ones of the banks BNK. The bank BNK may include an organic material or an inorganic material, but the present disclosure is not limited to a specific example.

The encapsulation layer ENC may be positioned on the connection electrode CE. At least a portion of the encapsulation layer ENC may be positioned on the bank BNK. The encapsulation layer ENC may be positioned at an outer portion of the display element part DPL to planarize separate components. The encapsulation layer ENC may include an organic material or an inorganic material, but the present disclosure is not limited to a specific material.

According to embodiments of the present disclosure, a light-emitting element, a method of manufacturing the light-emitting element, and a display device including the light-emitting element are provided which prevent or substantially prevent a misarrangement of light-emitting elements and improve luminous efficiency.

Aspects and features of the present disclosure are not limited to those described above, and other aspects and features of the present disclosure will be clearly understandable to those having ordinary skill in the art from the disclosures provided herein together with accompanying drawings.

It will be appreciated by those skilled in the art that various modifications, changes, and substitutions can be made without departing from the spirit and scope of the present disclosure. Therefore, the embodiments of the present disclosure described above may be implemented independently or in combination with each other.

Therefore, the embodiments disclosed in the present disclosure do not limit the technical scope of the present disclosure but explain the present disclosure, and the technical scope of the present disclosure will not be limited by the described embodiments. The protection scope of the present disclosure should be construed based on the accompanying claims, and all of the technical ideas included within the scope equivalent to the claims should be construed as being included within the scope of the present disclosure.

What is claimed is:

1. A display device comprising:

a substrate;

a light-emitting element comprising a first semiconductor layer comprising a first type semiconductor, a second semiconductor layer comprising a second type semiconductor different from the first type semiconductor, an active layer between one surface of the first semiconductor layer and a first surface of the second semiconductor layer in a first direction, a first electrode layer on a second surface of the second semiconductor layer, a second electrode layer arranged on another surface of the first semiconductor layer, and an insulating film continuously covering side surfaces of the first electrode layer, the first semiconductor layer, the active layer, the second semiconductor layer, and the second electrode layer and a second portion of a main surface of the first electrode layer facing in a second direction opposite to the first direction and exposed outside of the second semiconductor layer;

a first contact electrode on the substrate and electrically connected to the second electrode layer of the light-emitting element; and a second contact electrode on the substrate and electrically connected to the first electrode layer of the light-emitting element, wherein the first contact electrode is between the substrate and the second contact electrode, wherein the second electrode layer is between the substrate and the first electrode layer, wherein a diameter of the main surface of the first electrode layer is larger than a diameter of the second semiconductor layer, wherein a first portion of the main surface of the first electrode layer has the same diameter as and continuously contacts an entirety of the second surface of the second semiconductor layer, wherein the second portion of the main surface of the first electrode layer extends continuously from an outer edge of the first portion of the main surface to the side surface of the first electrode layer, wherein the insulating film does not expose the side surfaces of the first electrode layer and the second portion of the main surface, wherein the side surface of the first electrode layer is inclined to the main surface of the first electrode layer, and wherein the first portion and the second portion form the entirety of the main surface, and wherein an entirety of a surface of the second electrode layer exposed by the insulating film is in contact with the first contact electrode, and an entirety of a surface of the first electrode layer exposed by the insulating film is in contact with the second contact electrode.

2. The display device of claim 1, wherein the first contact electrode comprises a reflective material, and each of the first electrode layer, the second electrode layer, and the second contact electrode comprises a transparent conductive material.

3. The display device of claim 1, wherein the first electrode layer comprises a reflective material, and each of the second contact electrode and the second electrode layer comprises a transparent conductive material.

* * * * *